United States Patent [19]
Woods et al.

[11] Patent Number: 5,369,387
[45] Date of Patent: Nov. 29, 1994

[54] SHIM LEAD POWER COUPLING ASSEMBLY FOR SUPERCONDUCTING MAGNET

[75] Inventors: Daniel C. Woods; William S. Stogner, both of Florence, S.C.

[73] Assignee: General Electric Company, Milwaukee, Wis.

[21] Appl. No.: 880,848

[22] Filed: May 11, 1992

[51] Int. Cl.[5] .............................................. H01F 1/00
[52] U.S. Cl. ............................... 335/216; 174/17 VA
[58] Field of Search ............................ 335/216; 505/1; 174/15.4, 17 VA, 17.07, 15.1, 15.2, 15 VA

[56] References Cited

U.S. PATENT DOCUMENTS 5,166,776 11/1992 Dederer et al. .................. 357/716

Primary Examiner—Lincoln Donovan
Attorney, Agent, or Firm—Irving Freedman; James O. Skarsten

[57] ABSTRACT

A power coupling assembly for superconducting magnets includes a conduit with insulating tubes around each power lead, with the tubing passing through a plug at the upper end of the conduit and extending only part way to the lower end. Cryogen gas flowing from the magnet chamber into the conduit is forced to flow through the multiple tubes to cool the leads.

11 Claims, 3 Drawing Sheets

FIG_1

SHIM LEAD POWER COUPLING ASSEMBLY FOR SUPERCONDUCTING MAGNET

BACKGROUND OF THE INVENTION

This invention relates to a power coupling assembly for superconducting magnets, particularly suitable for connecting power to the shim magnets.

As is well known, a magnet can be made superconductive by placing it in an extremely cold environment, such as by enclosing it in a cryostat or pressure vessel containing liquid helium or other cryogen. The extreme cold reduces the resistance in the magnet coils to negligible levels, such that when a power source is initially connected to the coil (for a period, for example, of ten minutes) to introduce a current flow through the coils, the current will continue to flow through the coils due to the negligible resistance even after power is removed, thereby maintaining a magnetic field. Superconducting magnets find wide application, for example, in the field of magnetic resonance imaging (hereinafter "MRI").

Shim magnets are auxiliary magnet coils provided proximate to the main magnet coils to adjust or "finetune" the magnetic field produced by the main magnets, even in the presence of surrounding magnetic structures and/or magnetic flux emitting devices. Unlike the leads to the main magnet coils, the shim magnet coils are typically permanently connected in order to enable subsequent adjustment of the magnetic field to obtain a uniform magnetic field even in the presence of variations in the magnetic environment surrounding the superconducting magnet.

In a typical superconducting magnet, the cryostat or pressurized helium vessel is positioned within, but spaced from, an outer shell or vacuum vessel with a significant temperature gradient therebetween. As a result, the shim lead power coupling assembly must extend through a wide temperature range from the outside of the outer shell to the pressurized vessel. There is a need to minimize the heat conducted through the shim leads and the shim lead assembly to the cryogen, since even a single watt of heating can result in the boiling of 1.4 liters/hour of helium, which is completely unacceptable since a typical MRI specification limits the helium boil-off to 0.2 liters/hour. As a result, the helium gas boiled off, which is extremely cold (in the order of −270° C.), has been passed through the shim lead coupling assembly to remove a significant portion of the heat conducted down the wires.

The bare wire of the leads are provided with only a thin layer of insulation to enhance their heat transfer efficiency. However, thin insulation introduces the danger of shorts between adjacent leads. Moreover, a shim lead coupling assembly may typically include as many as thirty-six adjacent wires. Also, the diameter of the tube through which the leads pass must be minimized in order to minimize heat transfer through the tube, causing the leads to be placed close together, notwithstanding that the insulation must also be minimized in order to enhance heat transfer from the leads to the helium gas passing by. Thin Formvar insulating coatings can help provide needed removal of heat conducted down the leads but present problems of possible shorting between adjacent leads, particularly for current flow in excess of 10 amperes.

The shim lead power assembly design should optimize the electrical parameters by minimizing lead resistance and power consumption, along with heating, while at the same time preventing electrical shorts even in the presence of the differential expansion of materials in the presence of temperature cycles to which the assembly is subjected when placing it into operation, and during operation of the shim magnet coils. The thermal parameters must also be optimized to minimize heat conducted to the magnet. Moreover, heating due to current flow through the power coupling assembly must be minimized, not only to minimize the helium boil-off, but also to avoid quenching of the magnetic field after it is initially ramped to field.

As a result, conflicting thermal, electrical, magnetic and mechanical considerations and factors must be balanced and compromised in order to obtain an optimum design.

OBJECTS AND SUMMARY OF THE INVENTION

Accordingly, a primary object of the present invention is to provide a new and improved shim lead power coupling assembly for a superconducting magnet which minimizes the electrical resistance of the shim leads.

Another object of the present invention is to provide an improved shim lead power coupling assembly for a superconducting magnet in which the electrical heating and power losses are minimized, and electrical shorts between adjacent leads are prevented.

Still another object of the present invention is to provide an improved shim lead power coupling assembly for a superconducting magnet which minimizes the heat conducted to the pressurized helium vessel while providing a relatively high current carrying capacity, and avoiding quenching of the magnetic field.

In order to attain the above and other related objectives, in carrying out the present invention in one form thereof, a shim lead power coupling assembly extends between the exterior of the outer shell of a superconducting magnet to the pressurized vessel cryostat and includes at least one hole in the bottom of the assembly through which cryogenic boil-off gas passes. The upper end of the tube is plugged and a plurality of tubes are each sealed to pass through the plug and around a shim lead such that the cryogenic gas passes through the annulus between the shim leads and the inside of the tubing to the outside of the plug where it is vented to the atmosphere. Thus, the cooling cryogenic gas is directed along the shim leads to efficiently remove heat of solid conduction. Also, Teflon tubes insulate each shim lead to effectively prevent shorting between the leads. To prevent thermoacoustic oscillations from occurring, the Teflon tubes do not extend all the way to the bottom of the shim leads adjacent the pressurized vessel. Teflon tubes are not required at the bottom because the bottoms of the shim leads are cooled by conduction by the liquid helium bath and therefore lead shorting will not occur due to resistance heating, since the temperature is kept below the temperature required for lead insulation breakdown.

Figure 1:
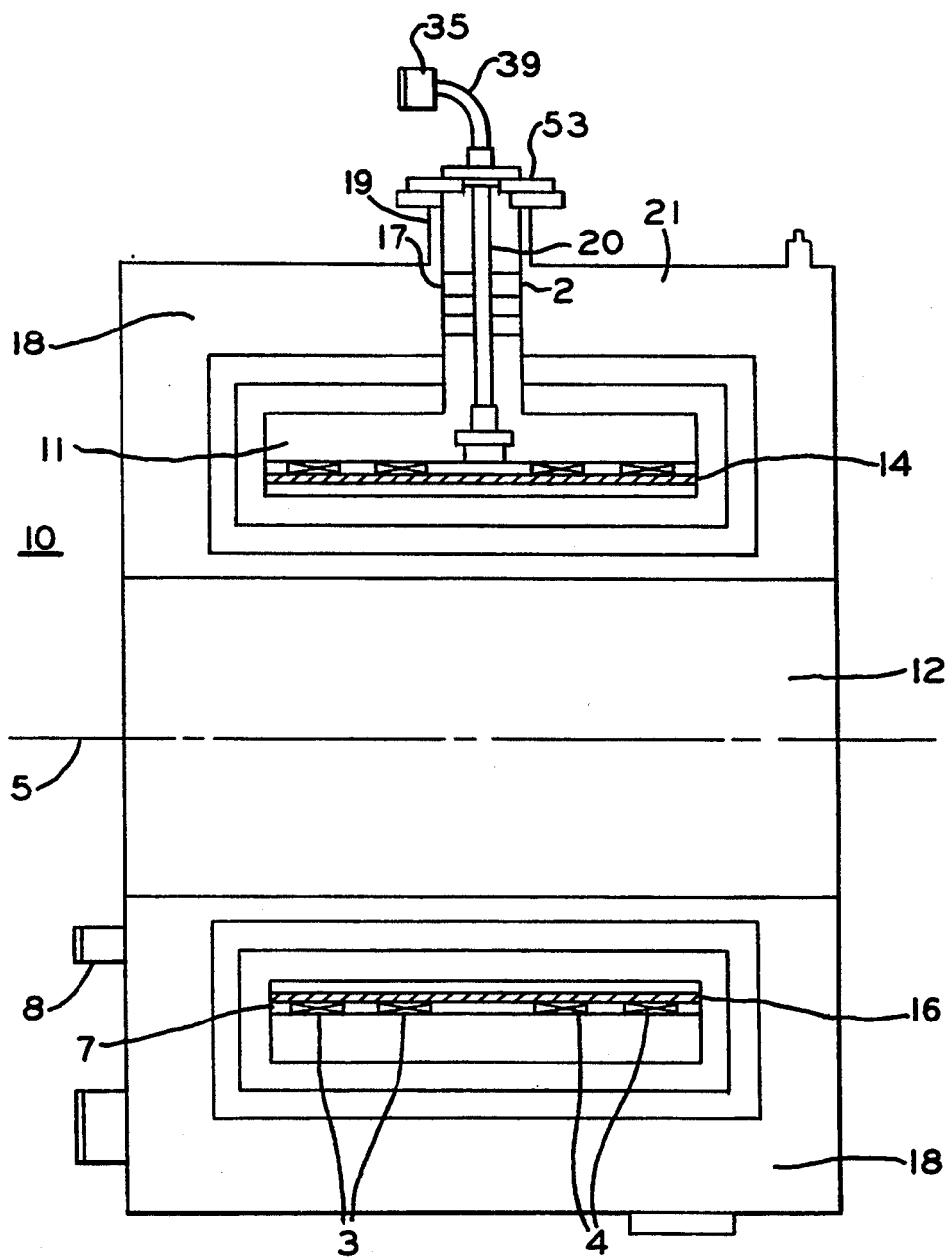
FIG. 1 is a simplified drawing of a superconducting magnet assembly utilizing the present invention.

Referring first to FIG. 1. Superconducting magnet assembly 10 includes an inner pressure vessel 11 containing liquid helium provided through a suitable fill port (not shown), and positioned within an outer shell or vacuum vessel, a portion of which is indicated by the outer walls 19. The space 21 between the outer shell walls 19 and the pressure vessel 11 provides insulation. The magnet bore 12 is formed within the magnetic coil support structure which can be a composite drum 7 manufactured using resin-impregnated strands of glass fiber rovings wound around a mandrel and wetted with epoxy, after which the drum is cured, machined and extracted from the mandrel. The main magnet coils, indicated generally as 3 and 4, are wound circumferentially around the outer surface of the composite drum 7 about the axis 5 of the assembly. A plurality of shim magnet coils, such as 14 and 16, are wound in directions transverse to main magnet coils 3 and 4 to provide adjustments to the magnetic field produced by the main magnet coils to obtain the desired uniformity of the magnetic field within the magnet bore 12.

It is to be noted that the multi-connector shim lead assembly 20 extends from the outer shell wall 19 through well 2 to a cryogenic connector 31 (better illustrated in FIG. 2), which is attached to connector platform 38. Thus, shim lead power coupling assembly 20 extends from room temperatures at the top portion to cryogenic temperatures (in the order of −273° C.) at the bottom of the assembly.

Figure 2:
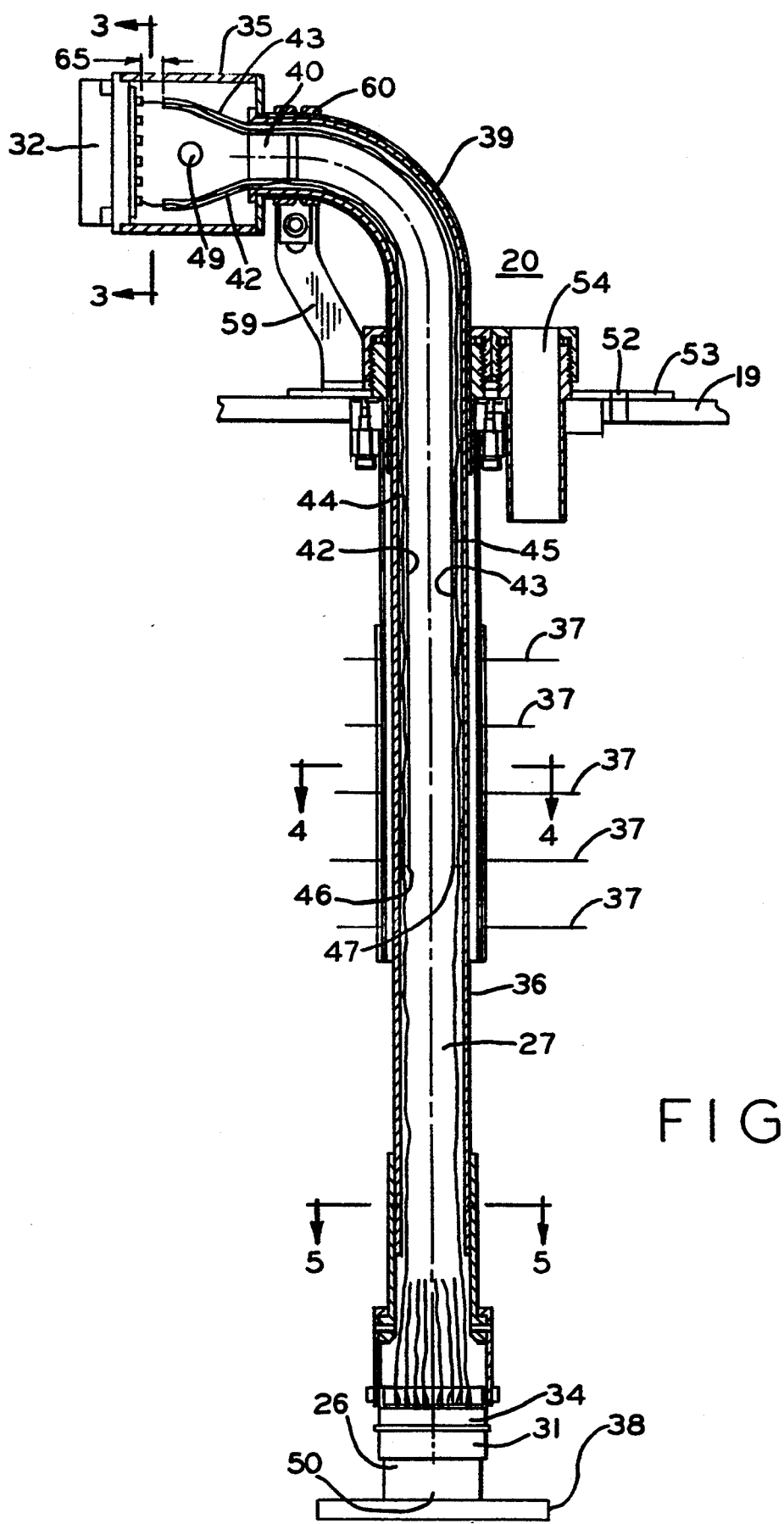
FIG. 2 is an enlarged view of the shim lead power coupling assembly shown in FIG. 1.
Figure 3:
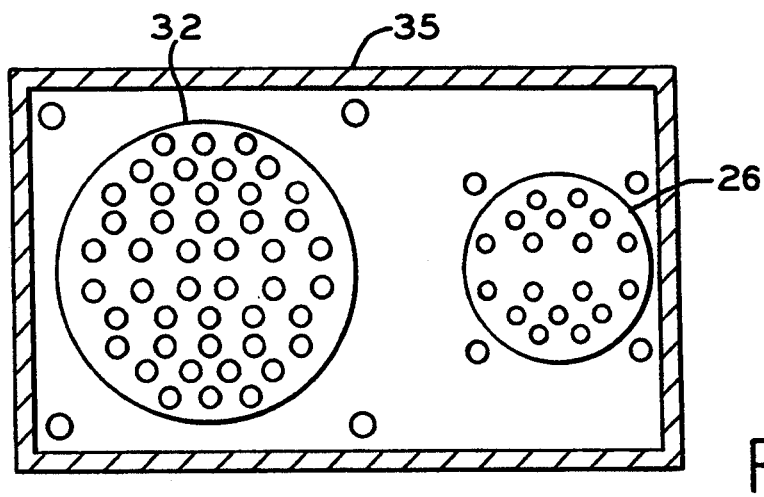
FIG. 3 is a cross section of the upper connector assembly in the direction shown by arrows 3—3 in FIG. 2.

Referring next to FIGS. 2 and 3. Shim lead assembly 20 includes a central insulating tube 36 with a right angle extension 39 at the upper end which terminates in enclosure 35 at one or more multi-conductor electrical connectors 32 sealed within the enclosure. A transverse plug or bulkhead 40 extends across right angle extension 39. The bulkhead formed by plug 40 is sealed with a cryogenic epoxy, and a plurality of Teflon tubes such as 42 and 43 pass through gas-tight seals in the bulkhead to the interior of enclosure 35.

Figure 4:
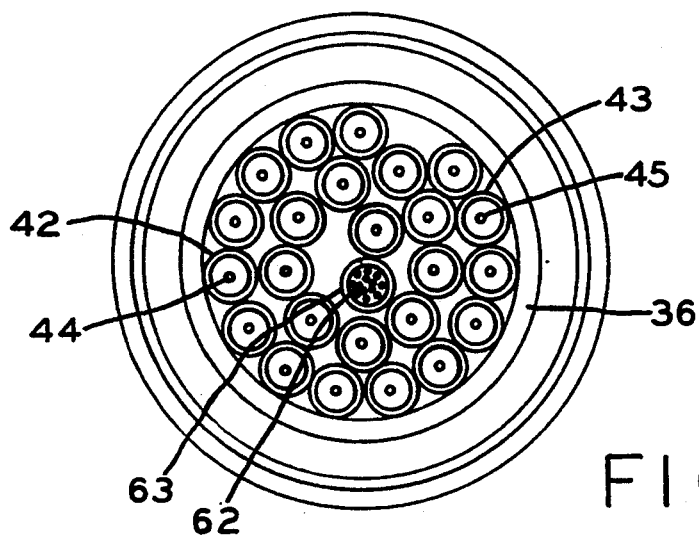
FIG. 4 is a cross sectional view of the central area of the assembly in the direction shown by arrows 4—4 in FIG. 2.
Figure 5:
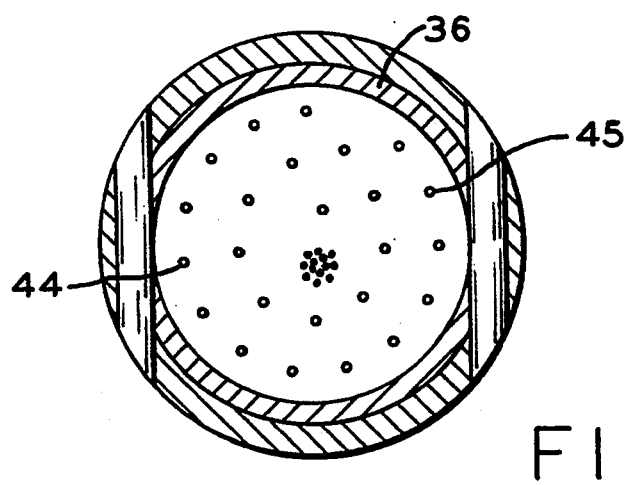
FIG. 5 is a cross section of the lower portion of the assembly of FIG. 2 in the direction shown by arrows 5—5 in FIG. 2.

The wires or leads, such as 44 and 45, which are typically 20-gauge brass, pass through the center of the Teflon tubes, such as 42 and 43 (also see FIGS. 4 and 5). It is to be noted that lower ends 46 and 47 of Teflon tubes 42 and 43, respectively, terminate in a region which is approximately eight inches up from the bottom of the shim lead power coupling assembly (which may be around two feet long in a typical installation). Ending Teflon tubes such as 42 and 43 above the cold end or cryogen connector 34 protects against thermoacoustic oscillation which might otherwise occur due to the relatively large aspect ratio (length/diameter) of the Teflon tubes such as 42 and 43. This phenomenon, which occurs in cryogenics, is a form of resonance which can greatly increase the helium boil-off by as much as an order of magnitude. The Teflon tubes such as 41 and 42 must avoid causing thermoacoustic oscillations, and also must avoid providing vapor lock conditions in which lead cooling would be minimized, possibly causing leads to fuse open due to excessive resistance heating of the leads. In fact, the conventional wisdom expressed by engineers skilled in the superconducting magnet art in reviewing the design of the present invention was that vapor lock would occur in such an arrangement. However, testing has proven that both vapor lock and thermoacoustic oscillations are avoided with the design of the present invention. Standard Teflon tubes such as 42 and 43 have an outside diameter of 0.173 inches and an inside diameter of 0.133 inches. Test results indicated that 25 amperes can be passed through 20-gauge brass leads or wires such as 44 and 45 without shorting occurring, while maintaining desired thermal efficiency and minimum system boil off of helium, and while at the same time also avoiding thermoacoustic oscillations, vapor lock or quenching of the magnetic field.

Leads such as 44 and 45 thus pass from connector 32 in enclosure 35 through bulkhead 40 within Teflon tubes such as 42 and 43, through the central tube or conduit 36, where they pass out of the lower ends 46 and 47 of the Teflon tubes through the cold end of the central tube 36 to cold end connector 34, which in turn connects through cryostat connector 26 (which passes through wall 38 of pressure vessel 11) for connection to shim magnets 14 and 16.

A portion of the helium gas boil-off passes from the interior of pressure vessel 11 by way of apertures such as 50 through cryostat connector 26 and mating cold end connector 34 into the cold end of the central tube 36. Apertures 50 may be provided by removal of excess connector pins from industry standard connectors as described in copending U.S. patent application Ser. No. 07/880847, filed concurrently herewith by the present inventors and David R. Turner, assigned to the same assignee as the present invention and hereby incorporated by reference. Also see U.S. Pat. No. 5,099,215, issued Mar. 24, 1992, filed by the present inventors, and also assigned to the same assignee as the present invention and hereby incorporated by reference. The upper or warm end of extension 39 of tube 36 is blocked by plug or bulkhead 40, limiting the only passages for the liquid helium to those through the Teflon tubes such as 42 and 43. The cooling helium gas from pressure vessel 11 thus first flows over the lower ends of the shim leads such as 44 and 45 into the lower ends such as 46 and 47 of Teflon tubes such as 42 and 43 to flow through the tubes and along the leads, cooling the leads. The cooling helium gas then flows through the Teflon tubes and through bulkhead 40 into enclosure 35, where it is subsequently vented through the vent connection 49 which leads to the atmosphere. The lower ends of leads such as 44 and 45 in the region below Teflon tubes 42 and 43 are in intimate contact with cryogenic temperatures where shorting between adjacent leads will not be a problem, since at these relatively low temperatures resistance heating will not be high enough to cause breakdown of the thin Formvar insulation coating.

As best shown in FIG. 2, shim lead assembly 20 is connected through connector 34 at the cold end thereof to cryogenic connector 26 which is attached to connector platform 38, and is secured at the upper or warm end by bolts or other suitable fasteners which pass through apertures 52 spaced around the periphery of fastening plate 53 to fasten the assembly to the outer shell wall 19. The fastening plate 53 also supports a pair of main field lead openings 54 for access to the main coil lead pins (not shown) for main magnet coils such as 3 and 4 during ramping of the superconducting magnet, after which the apertures 54 are sealed by covers 55 after the main coil leads are removed. A power connection assembly for the main coil lead pins suitable for use in connection with the present invention is shown in the aforementioned U.S. patent application Ser. No. (15-NM-3703/3756).

A plurality of radiation baffles 37 fastened to the central tube 36 extend transverse to axis 27 of the central tube within well 2. Radiation baffles 37 are aluminized Mylar to reflect heat, and are secured in place on a baffle tree sleeve 56 which surrounds central tube 36 in the region of the radiation baffles. An adjustable bracket 59 supports shim lead elbow 39 on fastening plate 53 on one end, and to clamp 60 which surrounds the shim lead elbow on the other end.

Shim lead power coupling assembly 20 also includes a plurality of small 30-gauge magnet switching leads 62 within Teflon tube 63, as best shown in FIGS. 4 and 5, which extend between a separate warm end connector 26 (see FIG. 3) in enclosure 35 to the shim magnets. Magnet switching leads 62 do not carry high current, and do not need to be separately passed through individual tubes such as those provided for shim magnet power leads 44 and 45. Leads 62 are provided to enable the selective energization of the shim magnets through selectively opening a pair of connections to the ends of a selected shim magnet coil such as 14 and 16 for energization purposes, after which the energization is removed and the opening reconnected to form a closed circuit through which the superconducting current in the shim magnet coils may pass and continue to flow.

The present invention has proved to be thermally and electrically efficient in the presence of extreme temperature variations or gradients while avoiding electrical shorting, thermoacoustic oscillations and vapor lock.

While the present invention has been described with respect to certain preferred embodiments thereof, it is to be understood that numerous variations in the details of construction, the arrangement and combination of parts, and the type of materials used may be made without departing from the spirit and scope of the invention.

What we claim is:

1. In a superconducting magnet located in a pressurized chamber cryostat containing a liquid cryogen, with an outer shell spaced from the pressurized chamber, an assembly to connect electrical power from outside the shell to a plurality of magnet coils positioned within said chamber through a first multi-conductor connector in which the leads are insulated from each other passing through the wall of the chamber and connected to said magnet coils comprising:

a conduit extending from outside said shell to said first connector;
   a second multi-conductor connector in which the leads are insulated from each other positioned at the end of said conduit remote from said first connector;
   a plurality of electrically conducting leads insulated from each other extending between said first connector and said second connector;
   insulating tubing surrounding at least a portion of each of the lengths of said plurality of leads remote from said cryostat;
   an opening through said first connector to allow cryogen gas to pass from said cryostat into said conduit; and
   a plug across said conduit in the end proximate said second connector;
   said insulating tubing secured to said plug to limit and direct said cryogen gas to flow through said insulating tubing and around said leads to cool said leads while preventing electrical shorting of the leads;
   whereby said cryogen gas flows through said first connector and separates in said conduit to flow through said tubing and around said leads before being vented.

2. The lead coupling assembly for a superconducting magnet of claim 1 wherein the ends of said tubing proximate to said first multi-conductor connector terminate a distance above said first connector presenting first open ends toward said first connector.

3. The lead coupling assembly for a superconducting magnet of claim 2 wherein:
   said second connector is positioned in a housing at the end of said shell remote from said first connector; and
   a vent through said housing vents said cryogen gas after passing through said tubing.

4. The lead coupling assembly for a superconducting magnet of claim 3 wherein said tubing is Teflon.

5. The lead coupling assembly for a superconducting magnet of claim 2 wherein the distance from said first connector to the bottoms of said tubing is in the order of one-third of the distance between said first connector and said second connector in order to prevent thermoacoustic oscillations of said tubing.

6. The lead coupling assembly for a superconducting magnet of claim 5 wherein said tubing has an inside diameter in the order of 0.13 inches and said leads are in the order of 20-gauge wire and said tubing is dimensioned and configured to prevent vapor lock within the individual insulating tubing members while providing cooling of said leads.

7. The lead coupling assembly for a superconducting magnet of claim 5 wherein said leads are brass.

8. The lead coupling assembly for a superconducting magnet of claim 5 wherein a third multiconductor connector is attached to said tubular member at the end adjacent said first connector, and said third connector and said first connector include mating contacts to enable said assembly to be selectively attached and detached from electrical contact with said first connector.

9. The lead coupling assembly for a superconducting magnet of claim 8 wherein said first and third connectors are industry standard configuration connectors, and said opening through said first connector comprises a plurality of absent contacts in an otherwise industry standard connector.

10. The lead coupling assembly for a superconducting magnet of claim 9 wherein the mating contacts are also absent from said third connector providing cryogen gas passages through said first connector and said third connector.

11. The lead coupling assembly for a superconducting magnet of claim 1 wherein a plurality of shim magnet switching leads pass through a single additional insulating tubing.

* * * * *